(12) United States Patent
Chang et al.

(10) Patent No.: US 11,495,926 B2
(45) Date of Patent: Nov. 8, 2022

(54) ELECTRICAL CONNECTOR ASSEMBLY AND ELECTRICAL CONNECTOR

(71) Applicant: Advanced Connectek Inc., New Taipei (TW)

(72) Inventors: Ming-Yung Chang, New Taipei (TW); Tzu Hao Li, New Taipei (TW); Chia Cheng He, New Taipei (TW); Mao-Sheng Chen, New Taipei (TW)

(73) Assignee: Advanced Connectek Inc., New Taipei (TW)

( * ) Notice: Subject to any disclaimer, the term of this patent is extended or adjusted under 35 U.S.C. 154(b) by 0 days.

(21) Appl. No.: 17/213,257

(22) Filed: Mar. 26, 2021

(65) Prior Publication Data

US 2021/0305758 A1 Sep. 30, 2021

(30) Foreign Application Priority Data

Mar. 31, 2020 (TW) .................................. 109203746

(51) Int. Cl.
| | |
|---|---|
| *H01R 24/60* | (2011.01) |
| *H01R 13/6582* | (2011.01) |
| *H05K 1/11* | (2006.01) |
| *H01R 12/72* | (2011.01) |
| *H01R 13/42* | (2006.01) |

(52) U.S. Cl.
CPC ........... *H01R 24/60* (2013.01); *H01R 12/724* (2013.01); *H01R 13/42* (2013.01); *H01R 13/6582* (2013.01); *H05K 1/111* (2013.01)

(58) Field of Classification Search
CPC .............. H01R 13/6658; H01R 23/688; H01R 23/6873; H01R 13/6582; H01R 13/42; H01R 24/60; H01R 12/724; H05K 1/111

USPC ................................................. 439/76.1, 108
See application file for complete search history.

(56) References Cited

U.S. PATENT DOCUMENTS

| | | | | | |
|---|---|---|---|---|---|
| 4,889,497 | A | * | 12/1989 | Riches | H01R 13/648 439/620.08 |
| 5,040,999 | A | * | 8/1991 | Collier | H01R 12/714 439/62 |
| 6,250,935 | B1 | * | 6/2001 | Mochizuki | H01R 13/658 439/74 |
| 6,685,485 | B2 | * | 2/2004 | Korsunsky | H05K 1/117 439/701 |
| 8,231,411 | B1 | * | 7/2012 | Westman | H01R 13/6471 439/607.05 |

(Continued)

*Primary Examiner* — Gary F Paumen
(74) *Attorney, Agent, or Firm* — JCIPRNET

(57) ABSTRACT

An electrical connector assembly including an electrical connector and a circuit board is provided. The electrical connector has a metallic plate and a plurality of terminals. The metallic plate separates the terminals into two different areas. The metallic plate has a first lateral surface. The circuit board is assembled to the electrical connector. The circuit board has a plurality of pads, a second lateral surface, and top and bottom surfaces opposite to each other. The pads are disposed on the top and bottom surfaces respectively. The second lateral surface is boarded between the top and bottom surfaces. The circuit board further includes at least one grounding circuit exposed from the second lateral surface and facing toward the first lateral surface. The metallic plate is electrically conducted to the grounding circuit by the first lateral surface when the circuit board is assembled to the electrical connector.

20 Claims, 7 Drawing Sheets

(56) References Cited

U.S. PATENT DOCUMENTS

2004/0038564 A1* 2/2004 Yan .................... H01R 13/6471
439/76.1
2014/0349496 A1* 11/2014 Zhu ...................... H05K 1/0219
439/108

* cited by examiner

ELECTRICAL CONNECTOR ASSEMBLY AND ELECTRICAL CONNECTOR

CROSS-REFERENCE TO RELATED APPLICATION

This application claims the priority benefit of Taiwan application no. 109203746, filed on Mar. 31, 2020. The entirety of the above-mentioned patent application is hereby incorporated by reference herein and made a part of this specification.

TECHNICAL FIELD

The disclosure relates to an electrical connector assembly.

BACKGROUND

Recently, with the increasing demand for higher transfer rate and storage capacity, USB3.1 Super Speed+ specification has been developed to improve USB transfer rate. In particular, because USB Type-C is the new specification that can provide a maximum transfer rate of up to 10 Gbps and achieve a faster transfer rate while transferring large-capacity files, the transfer time may be effectively shortened.

As the transmission speed of the high-speed transmission interface has greatly increased, the number of conductive terminals has increased and the distribution is dense. However, because the conductive metal conductors of the current serial bus interface are relatively close in space arrangement, the phenomenon of capacitive coupling is bound to increase during signal transmission. In turn, the interference situation during signal transmission is increased, thereby reducing the stability of signal transmission. Also, the impedance mismatch will interfere with signal transmission and simultaneously reduce the stability of signal transmission. Consequently, defects such as poor use quality and unstable signal are likely to occur.

In an example where an electrical connector assembly includes an electrical connector and a circuit board assembled with each other, although a metallic plate is provided between terminals of the electrical connector as a shield for separating the terminals on two different areas, the metallic plate still needs to be connected to grounding pads on upper and lower surfaces of the circuit board in order to effectively provide grounding and shielding effects. This approach is no different from seeking far and wide for what lies close at hand, and results in a limited performance.

Accordingly, how to provide an appropriate configuration to meet the transfer rate of the existing new specification while taking the design trend of making the electrical connector assembly light, thin, short and convenient to use into account is a problem to be addressed by the persons skilled in the art.

SUMMARY

The disclosure provides an electrical connector assembly, which exposes a grounding circuit from a lateral surface of a circuit board adjacent to a metallic plate, so that the metallic plate of an electrical connector is directly electrically conducted to the grounding circuit on the lateral surface, thereby improving a shielding effect of the metallic plate for a high frequency signal.

An electrical connector assembly of the disclosure includes an electrical connector and a circuit board. The electrical connector has a metallic plate and a plurality of terminals. The metallic plate separates the terminals into two different areas. The metallic plate has a first lateral surface. The circuit board is assembled to the electrical connector. The circuit board has a plurality of pads, a second lateral surface, and top and bottom surfaces opposite to each other. The pads are disposed between the top and bottom surfaces. The second lateral surface is boarded between the top and bottom surfaces. The circuit board further includes at least one grounding circuit exposed from the second lateral surface and facing toward the first lateral surface. The metallic plate is electrically conducted to the grounding circuit by the first lateral surface when the circuit board is assembled to the electrical connector.

An electrical connector assembly of the disclosure includes an electrical connector and a circuit board. The electrical connector includes a plurality of terminals, an insulative housing, a metallic plate, and a metallic shell. The terminals include a first set of terminals and a second set of terminals. The insulative housing includes an insulative main housing and an insulating body, wherein an insertion space is formed inside the insulative main housing, the first set of terminals are disposed on a top inner side of the insulative main housing, the second set of terminals are disposed on a bottom inner side of the insulative main housing, the first set of terminals and the second set of terminals are separated by the insertion space, and contact portions of the first set of terminals and contact portions of the second set of terminals are toward the insertion space. The metallic plate is retained in the insulating body and located between the first set of terminals and the second set of terminals. The metallic plate has a first lateral surface. The metallic shell encloses the insulative main housing. The circuit board is assembled to the electrical connector. The circuit board has a plurality of pads, a second lateral surface, and top and bottom surfaces opposite to each other. The pads are disposed between the top and bottom surfaces. The second lateral surface is boarded between the top and bottom surfaces. The circuit board further includes at least one grounding circuit exposed from the second lateral surface and facing toward the first lateral surface. The metallic plate is electrically conducted to the grounding circuit by the first lateral surface when the circuit board is assembled to the electrical connector.

In an embodiment of the disclosure, the metallic plate includes at least one first protrusion located on the first lateral surface, extending toward the second lateral surface and structurally abutted to the second lateral surface, and the metallic plate is electrically conducted to the grounding circuit by the first protrusion.

In an embodiment of the disclosure, the first lateral surface and the second lateral surface are parallel to each other and maintain a gap.

In an embodiment of the disclosure, an orthographic projection range of a high speed signal transmission terminal pair among the terminals on a plane where the metallic plate is located partially overlaps with the first protrusion.

In an embodiment of the disclosure, the electrical connector assembly is a Type-C electrical connector, the metallic plate includes a pair of first protrusions, and the pair of first protrusions are shielded between TX+/TX− terminals and RX+/RX− terminals, respectively.

In an embodiment of the disclosure, the metallic plate includes a recess and a pair of first protrusions located in the recess and opposite to each other. The circuit board includes a second protrusion and a pair of grounding circuits located on the second protrusion and facing away from each other.

The second protrusion is assembled in the recess so that the pair of first protrusions are abutted to the pair of grounding circuits respectively.

In an embodiment of the disclosure, the first lateral surface and the second lateral surface have mutually complementary contours.

In an embodiment of the disclosure, the first lateral surface and the second lateral surface have mutually complementary contours.

In an embodiment of the disclosure, the metallic plate further includes a pair of grounding legs respectively disposed on a pair of grounding pads among the pads, and the first lateral surface is located between the pair of grounding legs.

In an embodiment of the disclosure, the electrical connector further includes an insulating body, the terminals separated into the two different areas and the metallic plate are placed on the insulating body. In an embodiment of the disclosure, the metallic plate further includes a pair of side latches located on two opposite sides of the insulating body, and the first lateral surface faces away from the side latches.

In an embodiment of the disclosure, the metallic plate further comprises a pair of side latches located on two opposite sides of the insulative main housing and heads of side latches are toward the insertion space.

In an embodiment of the disclosure, a direction in which the metallic plate is electrically conducted to the grounding circuit is consistent with a plug/unplug direction of the electrical connector assembly.

In an embodiment of the disclosure, a direction in which the metallic plate is electrically conducted to the grounding circuit is orthogonal to a plug/unplug direction of the electrical connector assembly.

Based on the above, according to the foregoing embodiments of the disclosure, the circuit board exposes its grounding layer from the second lateral surface to form the grounding circuit, so that the first lateral surface of the metallic plate may be electrically conducted to the exposed grounding circuit when the circuit board is assembled to the electrical connector to become the electrical connector assembly. Therefore, for the electrical connector assembly, the above configuration may provide shorter grounding path to effectively improve the grounding and shielding effect.

DETAILED DESCRIPTION

Figure 1:
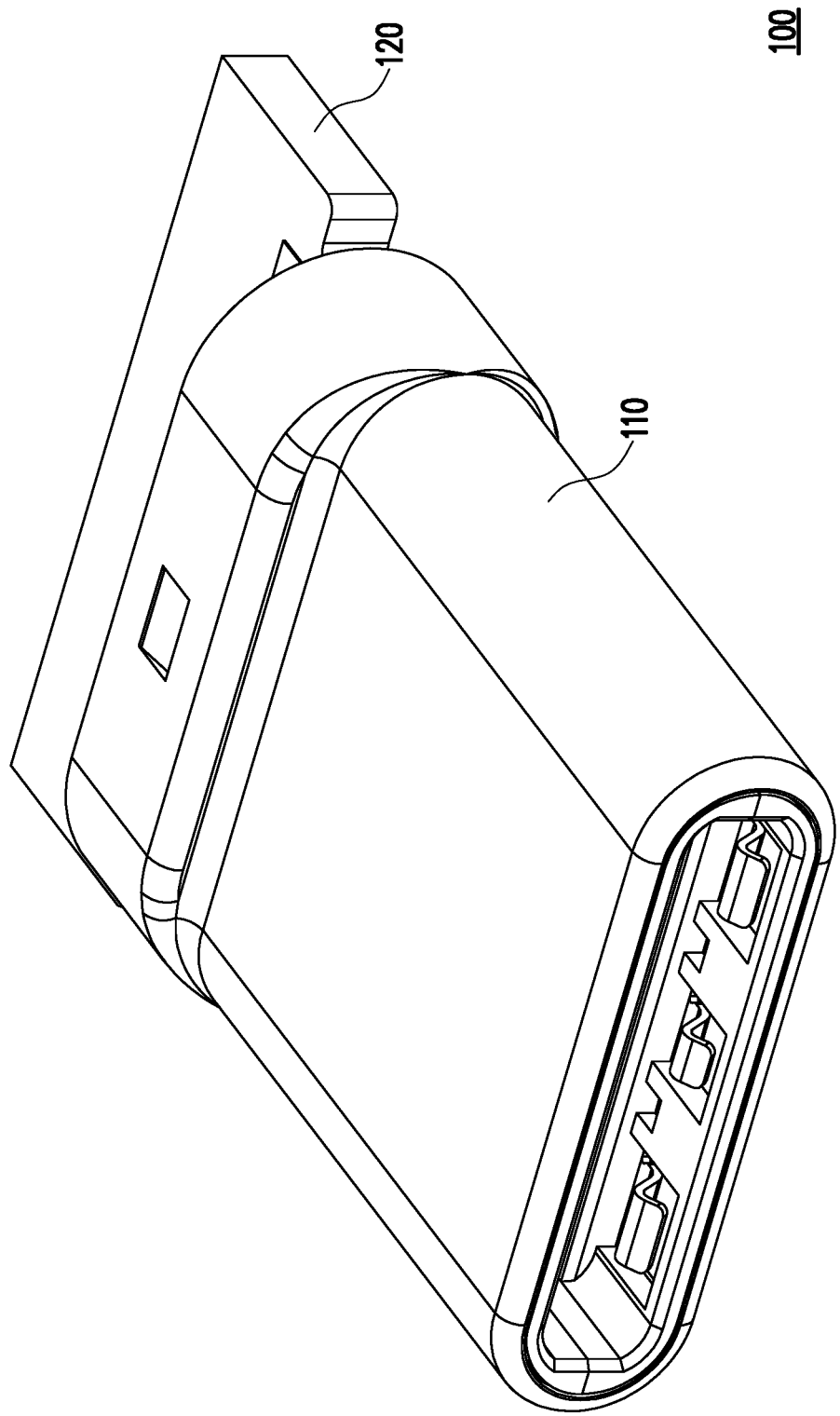
FIG. 1 is a schematic view of an electrical connector assembly according to another embodiment of the disclosure.
Figure 2:
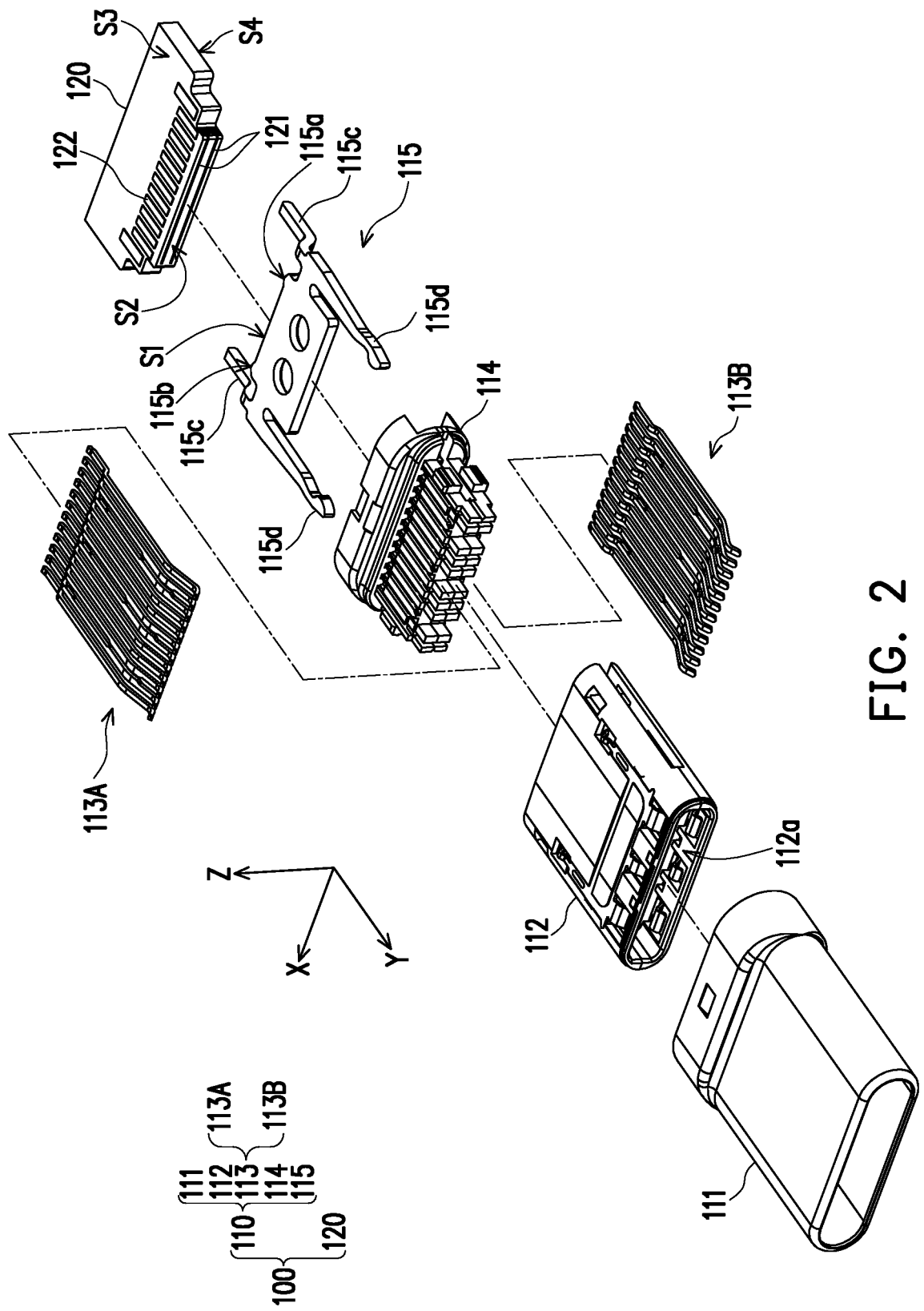
FIG. 2 is an explosion view of the electrical connector assembly of FIG. 1.

FIG. 1 is a schematic view of an electrical connector assembly according to another embodiment of the disclosure. FIG. 2 is an explosion view of the electrical connector assembly of FIG. 1. Referring to FIG. 1 and FIG. 2 together, in this embodiment, an electrical connector assembly 100 includes an electrical connector 110 and a circuit board 120 assembled to each other. Here, a Type-C electrical connector (and more especially, a plug electrical connector) is taken as an example, and rectangular coordinates X-Y-Z are provided to facilitate the component description. A plug/unplug direction of the electrical connector assembly 100 is substantially along the Y-axis.

In this embodiment, the electrical connector 110 includes a plurality of terminals 113, an insulative housing, a metallic plate 115, and a metallic shell 111, wherein the insulative housing includes an insulative main housing 112 and an insulating body 114, and the metallic shell 111 encloses the insulative main housing 112. Here, the metallic plate 115 retained in the insulating body 114 is made of a conductive material which separates the terminals 113 into two different areas to form a first terminal set 113A and a second terminal set 113B, and the metallic plate 115 is located between the first terminal set 113A and the second terminal set 113B. An insertion space 112a is formed inside the insulative main housing 112, the first set of terminals 113A are disposed on a top inner side of the insulative main housing 112, the second set of terminals 113B are disposed on a bottom inner side of the insulative main housing 112.

Further, the first terminal set 113A, the metallic plate 115 and the second terminal set 113B are placed-in-layer in the insulating body 114 along the Z-axis by means such as in-mold injection. Next, an assembly process of the electrical connector assembly 100 is completed by sequentially combining the insulative main housing 112, the metallic shell 111, and the circuit board 120. It should be mentioned that, as shown in FIG. 2, the metallic plate 115 has a first lateral surface S1 that faces toward the negative Y-axis direction. The circuit board 120 has a top surface S3 and a bottom surface S4 opposite to each other along the Z-axis. The circuit board 120 further includes a plurality of pads 122 respectively disposed on the top surface S3 and the bottom surface S4, a second lateral surface S2 boarded between the top surface S3 and the bottom surface S4, and a grounding circuit 121 exposed from the second lateral surface S2 and facing toward the first lateral surface S1. Here, the grounding circuit 121 substantially faces the positive Y-axis direction, and the grounding circuit 121 is a grounding layer (not shown) in the circuit board 120 extending to the second side S2 to be exposed. In the assembly process described above, when the circuit board 120 and the electrical connector 110 are assembled together, the metallic plate 115 is electrically conducted to the grounding circuit 121 on the second lateral surface S2 by the first lateral surface S1.

Figure 3A:
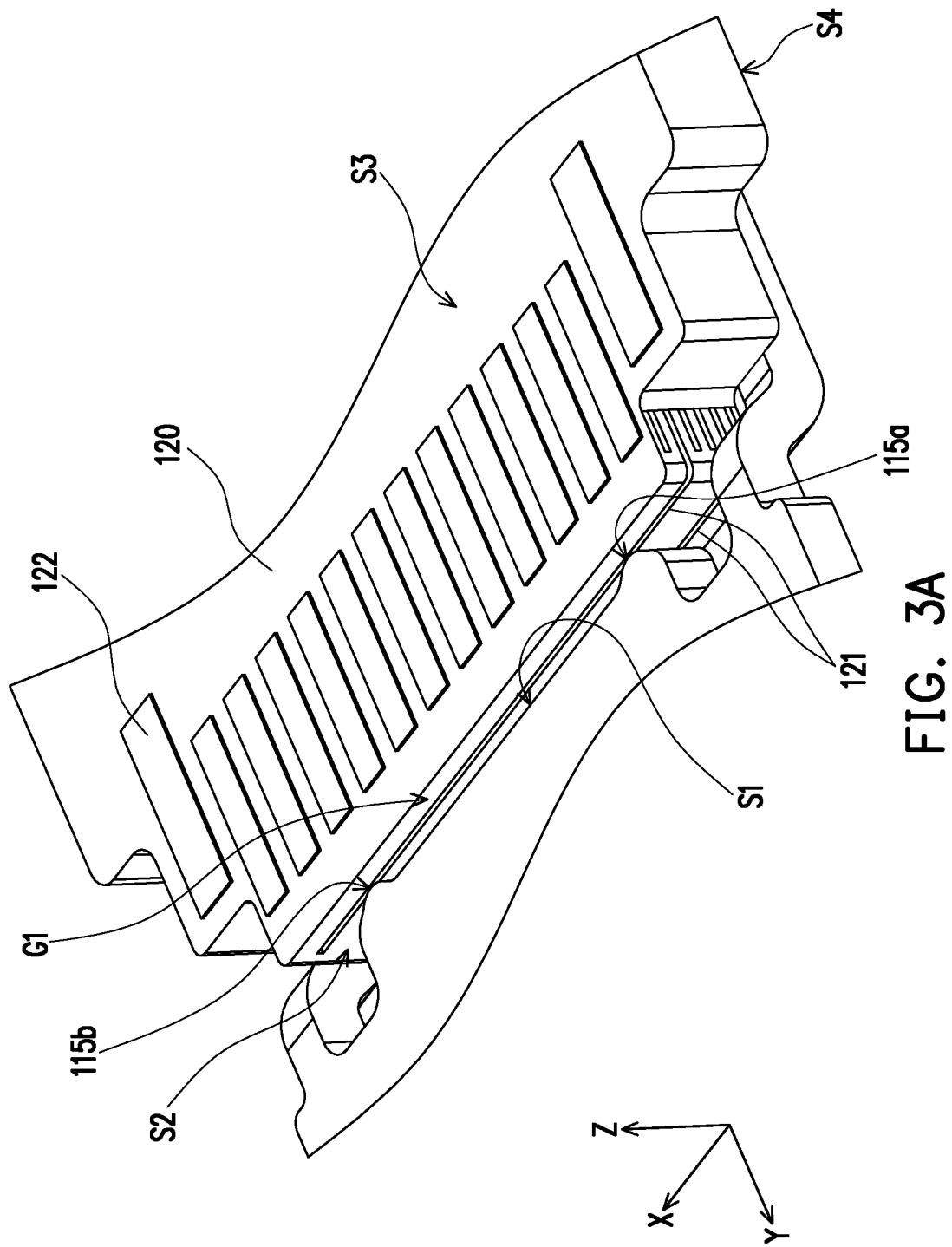
FIG. 3A to FIG. 3D are schematic views of certain components of the electrical connector assembly in different viewing angles.
Figure 3B:
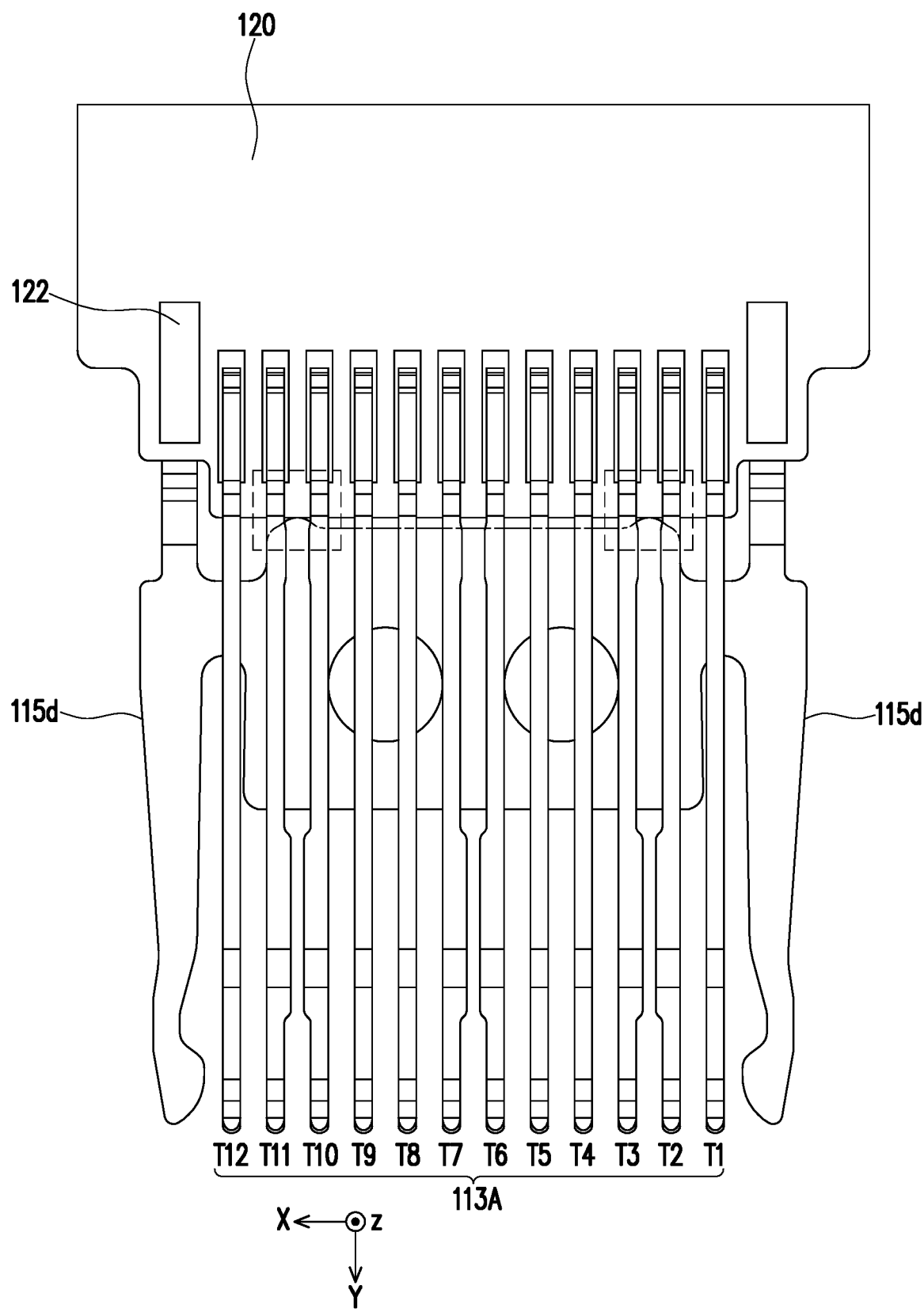
Figure 3C:
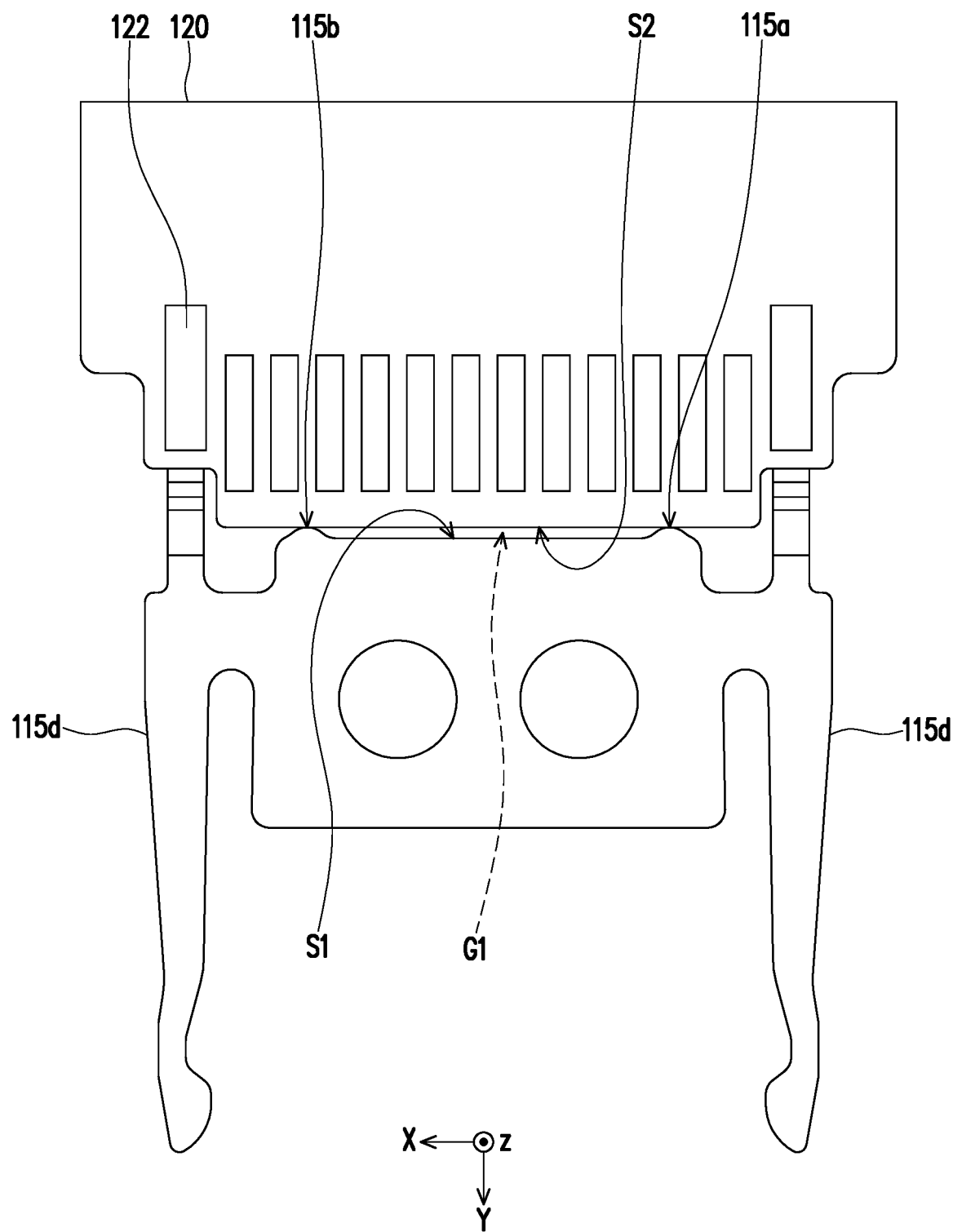

FIG. 3A to FIG. 3D are schematic views of certain components of the electrical connector assembly in different viewing angles. Referring to FIG. 3A to FIG. 3C, it should be noted that different component parts (the metallic plate 115, the first terminal set 113A and the circuit board 120) are separately shown here in order to clearly identify the correspondence between components relationship.

The metallic plate 115 includes at least one first protrusion (115a, 115b) located on the first lateral surface S1, extending toward the second lateral surface S2 and structurally abutted to the second lateral surface S2. The metallic plate 115 is electrically conducted to the grounding circuit 121 by the first protrusions 115a and 115b. In detail, the first lateral surface S1 and the second lateral surface S2 of the present embodiment are parallel to each other (and also parallel to the X-Z lane) and maintain a gap G1. The first lateral surface S1 and the second lateral surface S2 may also be regarded as being pushed away from each other due to the pair of first protrusions 115a and 115b. Accordingly, the protrusions 115a and 115b are directly and structurally abutted to the second lateral surface S2 of the circuit board 120 to be smoothly and electrically conducted to the grounding circuit 121. In other words, a direction in which the metallic plate 115 is electrically conducted to the grounding circuit 121 by the first lateral surface S1 is consistent with a plug/unplug direction of the electrical connector assembly 100, that is, all along the Y-axis direction. In another embodiment not shown, the first protrusions 115a and 115b may also be omitted. Instead, the first lateral surface S1 and the second lateral surface S2 are directly abutted to and contacted with each other to achieve a desired effect for electrical conduction.

The so-called electrical conduction can be completed by a physical structure contact, an auxiliary structural construction (such as overlapping), or through a conductive medium (such as soldering the two together by soldering material). Nonetheless, the specific connection structure or means is not particular limited.

Furthermore, referring to FIG. 3B and FIG. 3C, the terminals in the first terminal set 113A (which is the Type-C electrical connector) are numbered by T1, T2, T3, T4 . . . , T12. Among them, the numbers T2 and T3 are, for example, TX+/TX− terminals, and the numbers T10 and T11 are, for example, RX−/RX+ terminals. In other words, in the second terminal set 113B not shown, those corresponding to the numbers T2 and T3 will be RX+/RX− terminals, and those corresponding to the numbers T10 and T11 will be TX−/TX+ terminals. Accordingly, since orthographic projection contours of the first terminal set 113A and the second terminal set 113B on the X-Y plane overlap each other, only the first terminal group 113A on one side is taken as an example in FIG. 3B. In this embodiment, an orthographic projection range of a high speed signal transmission terminal pair (i.e., the TX+/TX− terminals and the RX+/RX− terminal described above) among the terminals 113 on a plane where the metallic plate 115 is located (i.e., the X-Y plane) partially overlaps with the first protrusions 115a and 115b of the present embodiment. That is to say, the first protrusions 115a and 115b of the metallic plate 115 may be shielded between the TX+/TX− terminals and the RX+/RX− terminals.

Accordingly, other than being directly and electrically conducted to the grounding circuit 121 of the circuit board 120 to provide shorter grounding path, the first protrusions 115a and 115b on the first lateral surface S1 may also be further shielded between the high speed signal transmission terminal pair. Therefore, when the electrical connector assembly 100 performs the high frequency signal transmission, the metallic plate 115 may effectively reduce the crosstalk interference generated by the high frequency signal through the first protrusions 115a and 115b, thereby improving its shielding performance.

Figure 3D:
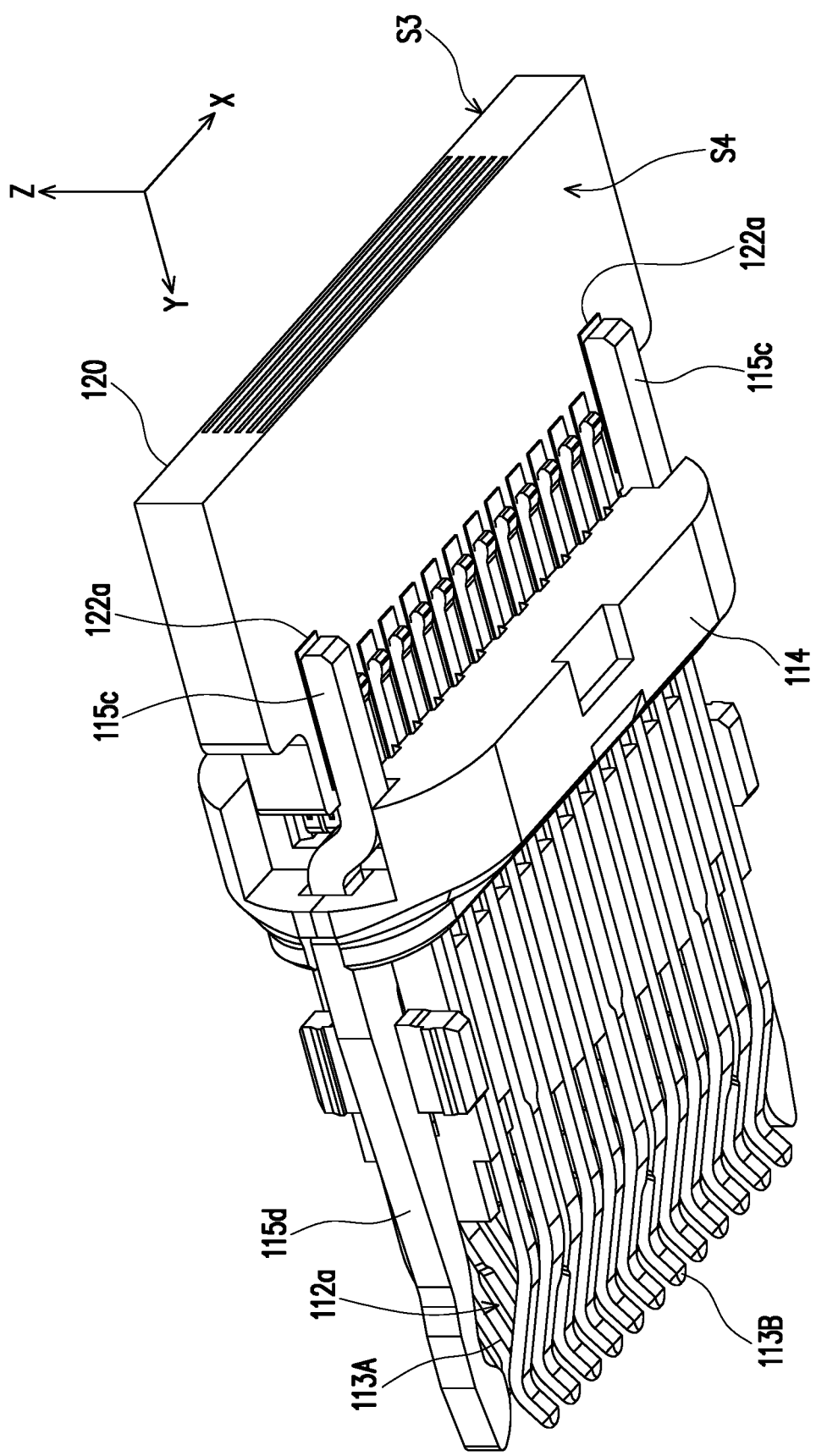

In addition, referring to FIG. 3B to FIG. 3D, the metallic plate 115 of the present embodiment further includes a pair of grounding legs 115c and a pair of side latches 115d. The grounding legs 115c are respectively disposed on a pair of grounding pads 122a among the pads 122. The first lateral surface S1 is located between the pair of grounding legs 115c. The side latches 115d are located on two opposite sides of the insulating body 114 along the X-axis. The first lateral surface S1 faces away from the side latches 115d. The side latches 115d are configured to hold another electrical connector to be docked with the electrical connector assembly 100 (e.g., a socket electrical connector), so as to prevent the electrical connector assembly 100 from falling out of the socket electrical connector, thereby improving the stability in the signal transmission process. Besides, as shown in FIG. 3D, the first set of terminals 113A and the second set of terminals 113B are separated by the insertion space 112a, and contact portions of the first set of terminals 113A and contact portions of the second set of terminals 113B are toward the insertion space 112a. Referring to FIGS. 2 and 3D, the side latches 115d are located on two opposite sides of the insulative main housing 112 and heads of side latches 115d are toward the insertion space 112a.

Figure 4:
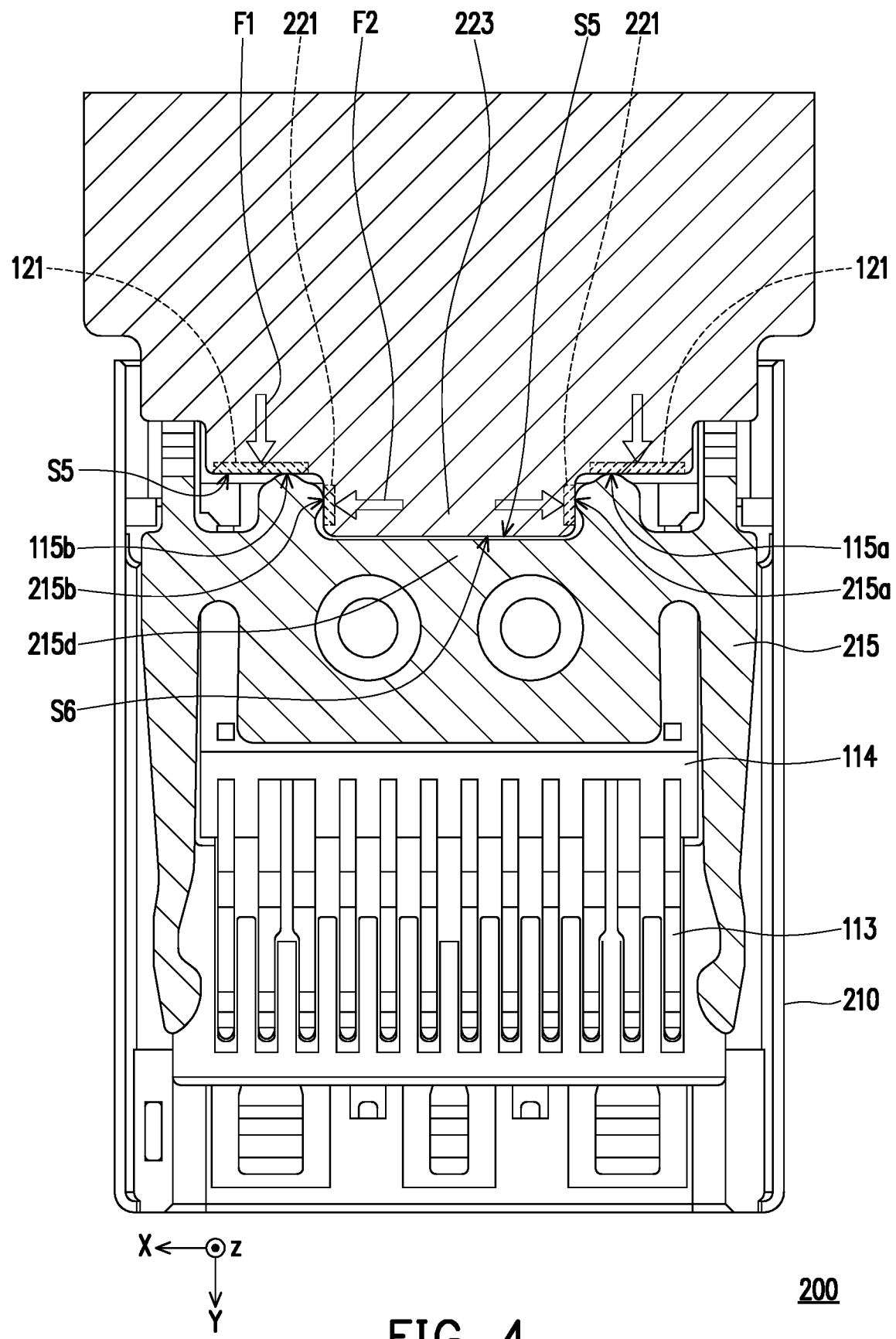
FIG. 4 is a schematic view of an electrical connector assembly in another embodiment of the disclosure.

FIG. 4 is a schematic view of an electrical connector assembly in another embodiment of the disclosure. Referring FIG. 4, an electrical connector assembly 200 of the present embodiment includes an electrical connector 210 and a circuit board 220 assembled to each other. Unlike the foregoing embodiment, in the electrical connector assembly 200 of the present embodiment, a metallic plate 215 further includes a recess 215d and a pair of first protrusions 215a and 215b located in the recess 215d and opposite to each other. The circuit board 220 further includes a second protrusion 223 and a pair of grounding circuits 221 located on the second protrusion 223 and facing away from each other. Here, the second protrusion 223 is assembled in the recess 215d so that the pair of first protrusions 215a and 215b are abutted to the pair of grounding circuits 221, respectively. As shown in FIG. 4, a direction in which the first protrusions 215a and 215b is abutted to the grounding circuits 221 is along the X-axis, that is, equivalent to being orthogonal to a plug/unplug direction (the Y-axis) of the electrical connector assembly 200. As shown in FIG. 4, a bonding force F2 is orthogonal to the Y-axis.

It should be noted that, the electrical connector assembly 200 of FIG. 4 still retains the first protrusions 115a and 115b and the grounding circuit 221 of the foregoing embodiment, and a bonding force F1 generated thereby allows the circuit board 220 and the metallic plate 215 to have mutually complementary contours on a first lateral surface S5 and a second lateral surface S6. In other words, each of the first lateral surface S5 and the second lateral surface S6 has a stepped contour, and thus the circuit board 220 and the metallic plate 215 are structures interfering and fitting with each other. In this way, the bonding strength between the two may be effectively improved.

However, it should be mentioned that, as can be easily inferred from the embodiment shown in FIG. 4, the bonding force F2 alone or the bonding force F1 alone is enough to successfully complete the assembly of the metallic plate 215 and the circuit board 220.

In summary, according to the foregoing embodiments of the disclosure, the circuit board exposes its grounding layer from the second lateral surface to form the grounding circuit, so that the first lateral surface of the metallic plate may be electrically conducted to the exposed grounding circuit when the circuit board is assembled to the electrical connector to become the electrical connector assembly. Therefore, for the electrical connector assembly, the above configuration may provide shorter grounding path to effectively improve the grounding and shielding effect. Furthermore, the metallic plate is abutted to the grounding circuit by the first protrusion, so that the first protrusion is also shielded between the pair of high speed signal transmission terminals separated at two opposite positions of the metallic plate. Therefore, the crosstalk interference caused by the high frequency signal transmission may be effectively prevented. In addition, the circuit board and the metallic plate may achieve a coupling state of an interference fit through their mutually complementary contours. As a result, the structural strength of the electrical connector assembly is improved, and the possible detachment situation is effectively avoided.

The invention claimed is:

1. An electrical connector assembly, comprising:
an electrical connector, having a metallic plate and a plurality of terminals, the metallic plate separating the terminals into two different areas, the metallic plate having a first lateral surface, wherein the electrical connector further comprises an insulating body and the metallic plate is placed in the insulating body, the metallic plate further comprises a pair of side latches located on two opposite sides of the insulating body, and the first lateral surface faces away from the side latches; and
a circuit board, assembled to the electrical connector, the circuit board having a plurality of pads, a second lateral surface, and a top surface and a bottom surface opposite to each other, the pads being disposed on the top surface or the bottom surface, the second lateral surface being boarded between the top surface and the bottom surface, wherein the circuit board further comprises at least one grounding circuit exposed from the second lateral surface and facing toward the first lateral surface, so that the metallic plate is electrically connected to the grounding circuit by the first lateral surface when the circuit board is assembled to the electrical connector.

2. The electrical connector assembly according to claim 1, wherein the metallic plate comprises at least one first protrusion located on the first lateral surface, extending toward the second lateral surface and structurally connecting to the second lateral surface, and the metallic plate is electrically connected to the grounding circuit by the first protrusion.

3. The electrical connector assembly according to claim 2, wherein the first lateral surface and the second lateral surface are parallel to each other and maintain a gap.

4. The electrical connector assembly according to claim 2, wherein an orthographic projection range of a high speed signal transmission terminal pair among the terminals on a plane where the metallic plate is located partially overlaps with the first protrusion.

5. The electrical connector assembly according to claim 2, wherein the electrical connector assembly is a Type-C electrical connector, the metallic plate comprises a pair of first protrusions, and the pair of first protrusions partially cover TX+/TX− terminals and RX+/RX− terminals, respectively.

6. The electrical connector assembly according to claim 2, wherein the metallic plate comprises a recess and a pair of first protrusions located in the recess and opposite to each other, the circuit board comprises a second protrusion and a pair of grounding circuits located on the second protrusion and facing away from each other, and the second protrusion is assembled in the recess so that the pair of first protrusions are abutted to the pair of grounding circuits respectively.

7. The electrical connector assembly according to claim 1, wherein the first lateral surface and the second lateral surface have mutually complementary contours.

8. The electrical connector assembly according to claim 1, wherein each of the first lateral surface and the second lateral surface has a stepped contour.

9. The electrical connector assembly according to claim 1, wherein the first lateral surface and the second lateral surface are in an interference fit.

10. The electrical connector assembly according to claim 1, wherein the metallic plate further comprises a pair of grounding legs respectively disposed on a pair of grounding pads among the pads, and the first lateral surface is located between the pair of grounding legs.

11. The electrical connector assembly according to claim 1, wherein a direction in which the metallic plate is electrically connected to the grounding circuit is consistent with a plug/unplug direction of the electrical connector assembly.

12. The electrical connector assembly according to claim 1, wherein a direction in which the metallic plate is electrically connected to the grounding circuit is orthogonal to a plug/unplug direction of the electrical connector assembly.

13. An electrical connector assembly, comprising:
an electrical connector, comprising:
a plurality of terminals, comprising a first set of terminals and a second set of terminals;
an insulative housing, comprising an insulative main housing and an insulating body, wherein an insertion space is formed inside the insulative main housing, the first set of terminals are disposed on a top inner side of the insulative main housing, the second set of terminals are disposed on a bottom inner side of the insulative main housing, the first set of terminals and the second set of terminals are separated by the insertion space, and contact portions of the first set of terminals and contact portions of the second set of terminals are toward the insertion space;
a metallic plate retained in the insulating body and located between the first set of terminals and the second set of terminals, wherein the metallic plate has a first lateral surface and the metallic plate further comprises a pair of side latches located on two opposite sides of the insulative main housing and heads of the side latches are toward the insertion space; and
a metallic shell enclosing the insulative main housing; and
a circuit board, assembled to the electrical connector, the circuit board having a plurality of pads, a second lateral surface, and a top surface and a bottom surface opposite to each other, the pads being disposed on the top surface or the bottom surface, the second lateral surface being between the top surface and the bottom surface, wherein the circuit board further comprises at least one grounding circuit exposed from the second lateral surface and facing toward the first lateral surface, so that the metallic plate is electrically connected to the grounding circuit by the first lateral surface when the circuit board is assembled to the electrical connector.

14. The electrical connector assembly according to claim 13, wherein the metallic plate comprises at least one first protrusion located on the first lateral surface, extending toward the second lateral surface and structurally connecting to the second lateral surface, and the metallic plate is electrically connected to the grounding circuit by the first protrusion.

15. The electrical connector assembly according to claim 14, wherein the first lateral surface and the second lateral surface are parallel to each other and maintain a gap.

16. The electrical connector assembly according to claim 14, wherein an orthographic projection range of a high speed signal transmission terminal pair among the terminals on a plane where the metallic plate is located partially overlaps with the first protrusion.

17. An electrical connector assembled with a circuit board, the circuit board having a plurality of pads, a second lateral surface, and a top surface and a bottom surface opposite to each other, the pads being disposed on the top surface or the bottom surface, the second lateral surface being between the top surface and the bottom surface and at least one grounding circuit exposed from the second lateral surface, the electrical connector comprising:
- an insulating body;
- a metallic plate; and
- a plurality of terminals, the terminals separated by the metallic plate into two different areas, wherein the metallic plate comprises a pair of side latches located on two opposite sides of the insulating body, the metallic plate are placed in the insulating body, the metallic plate further comprises a first lateral surface, and the first lateral surface faces away from the side latches, wherein the second lateral surface faces toward the first lateral surface, so that the metallic plate is electrically connected to the grounding circuit by the first lateral surface when the circuit board is assembled to the electrical connector.

18. The electrical connector according to claim 17, wherein the metallic plate comprises at least one first protrusion located on the first lateral surface, extending toward the second lateral surface and structurally connecting to the second lateral surface, and the metallic plate is electrically connected to the grounding circuit by the first protrusion.

19. An electrical connector assembled with a circuit board, the circuit board having a plurality of pads, a second lateral surface, and a top surface and a bottom surface opposite to each other, the pads being disposed on the top surface or the bottom surface, the second lateral surface being between the top surface and the bottom surface and at least one grounding circuit exposed from the second lateral surface, the electrical connector comprising:
- a plurality of terminals, comprising a first set of terminals and a second set of terminals;
- an insulative housing, comprising an insulative main housing and an insulating body, wherein an insertion space is formed inside the insulative main housing, the first set of terminals are disposed on a top inner side of the insulative main housing, the second set of terminals are disposed on a bottom inner side of the insulative main housing, the first set of terminals and the second set of terminals are separated by the insertion space, and contact portions of the first set of terminals and contact portions of the second set of terminals are toward the insertion space;
- a metallic plate retained in the insulating body and located between the first set of terminals and the second set of terminals, wherein the metallic plate has a first lateral surface and the metallic plate further comprises a pair of side latches located on two opposite sides of the insulative main housing and heads of side latches are toward the insertion space; and
- a metallic shell enclosing the insulative main housing, wherein the second lateral surface faces toward the first lateral surface, so that the metallic plate is electrically connected to the grounding circuit by the first lateral surface when the circuit board is assembled to the electrical connector.

20. The electrical connector according to claim 18, wherein the metallic plate comprises at least one first protrusion located on the first lateral surface, extending toward the second lateral surface and structurally connecting to the second lateral surface, and the metallic plate is electrically connected to the grounding circuit by the first protrusion.

\* \* \* \* \*